United States Patent
Koshiishi et al.

(10) Patent No.: US 11,189,945 B2
(45) Date of Patent: Nov. 30, 2021

(54) METHOD OF MANUFACTURING ELECTRICAL CONNECTION SOCKET, AND ELECTRICAL CONNECTION SOCKET

(71) Applicant: ENPLAS CORPORATION, Saitama (JP)

(72) Inventors: Kazutaka Koshiishi, Saitama (JP); Keiichi Narumi, Santa Clara, CA (US)

(73) Assignee: ENPLAS CORPORATION, Saitama (JP)

(*) Notice: Subject to any disclaimer, the term of this patent is extended or adjusted under 35 U.S.C. 154(b) by 0 days.

(21) Appl. No.: 16/768,039

(22) PCT Filed: Jun. 29, 2018

(86) PCT No.: PCT/JP2018/024827
§ 371 (c)(1),
(2) Date: May 28, 2020

(87) PCT Pub. No.: WO2019/106872
PCT Pub. Date: Jun. 6, 2019

(65) Prior Publication Data
US 2020/0366018 A1 Nov. 19, 2020

Related U.S. Application Data

(60) Provisional application No. 62/592,668, filed on Nov. 30, 2017, provisional application No. 62/592,670, filed on Nov. 30, 2017.

(51) Int. Cl.
*H01R 12/70* (2011.01)
*H01R 12/71* (2011.01)
(Continued)

(52) U.S. Cl.
CPC .......... *H01R 12/718* (2013.01); *G01R 1/045* (2013.01); *G01R 1/0466* (2013.01);
(Continued)

(58) Field of Classification Search
CPC .. H01R 12/718; H01R 12/716; H01R 12/714; H01R 12/71; H01R 12/7096;
(Continued)

(56) References Cited

U.S. PATENT DOCUMENTS 5,990,697 A * 11/1999 Kazama ................. G01R 1/067
324/72.5
7,198,493 B2 * 4/2007 Chen .................. H01R 13/2442
439/66

(Continued)

FOREIGN PATENT DOCUMENTS

| JP | 2006098376 A | 4/2006 |
| JP | 2007-198835 A | 8/2007 |

(Continued)

OTHER PUBLICATIONS

International Search Report from International Application No. PCT/JP2018/024827 dated Sep. 4, 2018.

*Primary Examiner* — Harshad C Patel
(74) *Attorney, Agent, or Firm* — Brundidge & Stanger, P.C.

(57) ABSTRACT

This electrical connection socket for relaying exchange of electrical signals between a first electrical component and a second electrical component, is provided with: a metallic casing which has a communication hole for communication between the upper surface and lower surface of the metallic casing, to the lower surface side of which the first electrical component is attached, and to the upper surface of which the second electrical component is attached; a signal pin which is disposed in the communication hole so as to be separated from the inner wall surface of the communication hole, one end of which is electrically connected to a terminal of the first electrical component, and the other end of which is electrically connected to a terminal of the second electrical component; an annular first holding member which is, in the
(Continued)

upper region of the communication hole, press-fitted in the communication hole; and an annular second holding member which is, in the lower region of the communication hole, press-fitted to the outer circumferential surface of the signal pin, wherein the signal pin is fixed in the communication hole so as to be held by the metallic casing from above and from below via the first and second holding members.

7 Claims, 9 Drawing Sheets

(51) Int. Cl.
*G01R 31/28* (2006.01)
*G01R 1/04* (2006.01)
G01R 1/067 (2006.01)
H01R 12/57 (2011.01)
H01R 13/193 (2006.01)

(52) U.S. Cl.
CPC ..... *G01R 31/2886* (2013.01); *G01R 31/2896* (2013.01); *G01R 1/06722* (2013.01); *H01R 12/57* (2013.01); *H01R 13/193* (2013.01)

(58) Field of Classification Search
CPC ........ H01R 12/91; H01R 12/57; H01R 12/58; H01R 13/193; H01R 13/6315; H01R 13/187; H01R 13/17; H01R 13/10; G01R 1/06722; G01R 1/67; G01R 1/0433; G01R 1/0425; G01R 1/07314; G01R 31/2886; G01R 31/2896
USPC .... 439/700, 66, 68, 81, 91, 591, 70, 71, 74, 439/82
See application file for complete search history.

(56) References Cited

U.S. PATENT DOCUMENTS

| | | | | |
|---|---|---|---|---|
| 7,210,952 | B2* | 5/2007 | Ishida | H05K 7/1061 439/331 |
| 7,220,134 | B2* | 5/2007 | Goodman | H01R 13/2421 439/70 |
| 7,456,645 | B2* | 11/2008 | Yoshida | G01R 1/06722 324/755.02 |
| 7,654,827 | B2* | 2/2010 | Arai | H01R 13/2414 439/66 |
| 7,666,000 | B1* | 2/2010 | Hsiao | G01R 1/0466 439/66 |
| 7,690,925 | B2* | 4/2010 | Goodman | H01R 13/2421 439/70 |
| 7,845,955 | B2* | 12/2010 | Nakayama | G01R 1/07371 439/66 |
| 7,950,927 | B2* | 5/2011 | Kazama | G01R 3/00 439/66 |
| 8,758,066 | B2* | 6/2014 | Zhou | G01R 1/0675 439/700 |
| 8,957,693 | B2* | 2/2015 | Tsubaki | G01R 1/07314 324/756.02 |
| 2006/0066331 | A1 | 3/2006 | Yoshida | |
| 2012/0182037 | A1* | 7/2012 | Tsubaki | G01R 1/0483 324/756.02 |
| 2012/0315775 | A1 | 12/2012 | Zhou | |
| 2013/0203298 | A1 | 8/2013 | Zhou | |
| 2016/0268710 | A1* | 9/2016 | Zhang | H01R 12/7076 |
| 2017/0059611 | A1* | 3/2017 | Lesnikoski | G01R 1/045 |
| 2020/0366018 | A1* | 11/2020 | Koshiishi | G01R 1/045 |

FOREIGN PATENT DOCUMENTS

| | | |
|---|---|---|
| JP | 2014-517310 A | 7/2014 |
| JP | 2015-507198 A | 3/2015 |

* cited by examiner $$Z_0 = \frac{138}{\sqrt{k}} \log \frac{d_1}{d_2}$$

Where, $Z_0$ = Characteristic impedance of line
$d_2$ = Inside diameter of outer conductor
$d_1$ = Outside diameter of inner conductor
$k$ = Relative permittivity of insulation between conductors

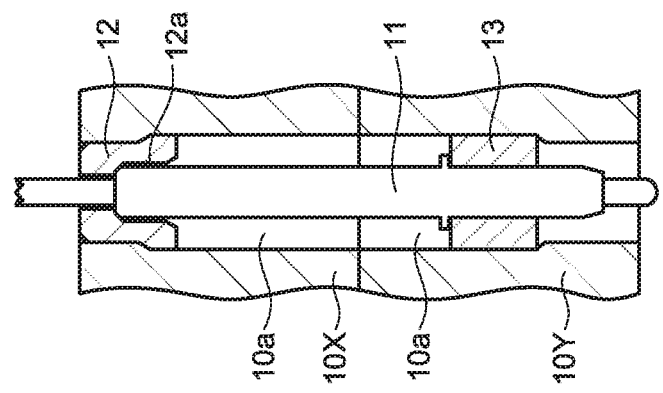
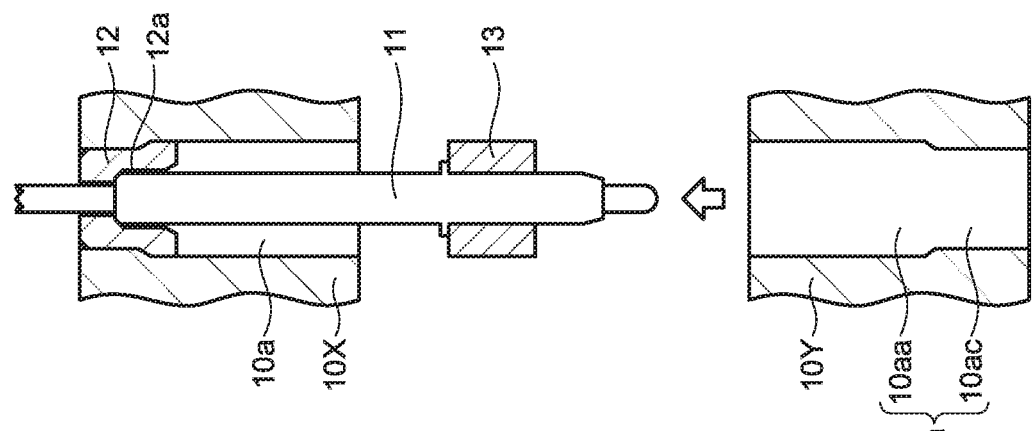
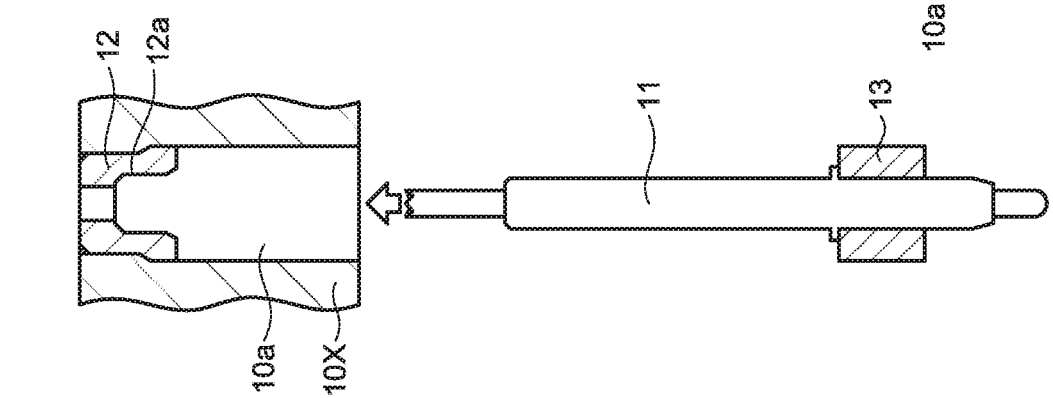
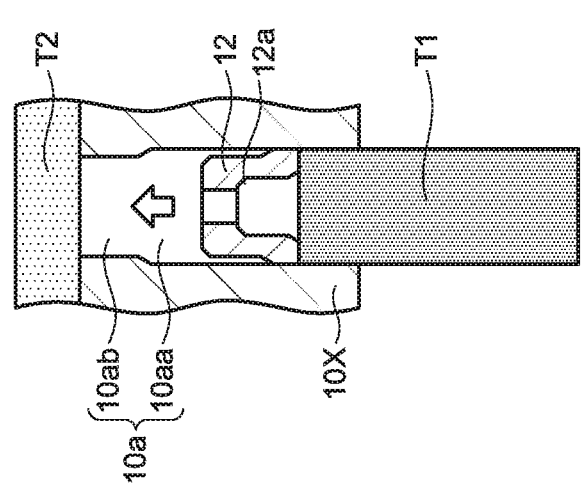

METHOD OF MANUFACTURING ELECTRICAL CONNECTION SOCKET, AND ELECTRICAL CONNECTION SOCKET

TECHNICAL FIELD

This disclosure relates to an electrical connection socket.

BACKGROUND ART

A socket for relaying the transmission and reception of electrical signals between an electrical component (e.g., an IC package) and a circuit board (e.g., a PCB board) is known (e.g., PTL 1).

Electrical connection sockets of such a type are desired to relay high-frequency electrical signals (e.g., 10 GHz) in view of increasing the data transfer rate in recent years. In view of this, the electrical connection socket is configured such that a signal pin configured for signal transmission is inserted in a communication hole provided in a grounded metal housing for the purpose of suppressing the signal deterioration. In this manner, the signal pin forms a so-called coaxial line with the inner wall surface of the communication hole of the metal housing, and provides an impedance-matched signal path between the electrical component and the circuit board.

CITATION LIST

Patent Literature

PTL 1
Japanese Unexamined Patent Application Publication (Translation of PCT Application) No. 2015-507198

SUMMARY OF INVENTION

Technical Problem

Note that in the electrical connection socket of the above-mentioned type, the signal pin is held by an insulating holding member in the communication hole and is disposed apart from the inner wall surface of the communication hole for the purpose of forming a coaxial line with the inner wall surface of the communication hole of the metal housing.

In this respect, even slight deviation of the distance between the outer peripheral surface of the signal pin and the inner wall surface of the communication hole leads to mismatch of the impedance of the signal path, and therefore the improvement of the mechanical stability of the holding state of the signal pin is desired. However, since the diameter of the signal pin is typically as small as a few millimeters, manufacture of the electrical connection socket itself may be difficult depending on the holding structure of the signal pin.

In view of the above problems, an object of the present disclosure is to provide an electrical connection socket that can maintain a high mechanical stability of the holding state of the signal pin in the metal housing with a simple configuration and a simple manufacturing process.

Solution to Problem

A main present disclosure that solves the above-mentioned problems is an electrical connection socket for relaying transmission and reception of an electrical signal between a first electrical component and a second electrical component, the electrical connection socket including a metal housing including a communication hole for communicating between an upper surface of the metal housing and a lower surface of the metal housing, the metal housing being disposed such that the first electrical component is disposed at the lower surface, and that the second electrical component is disposed at the upper surface; a signal pin disposed apart from an inner wall surface of the communication hole in the communication hole such that one end of signal pin is electrically connected to a terminal of the first electrical component and that another end of the signal pin is electrically connected a terminal of the second electrical component; a first holding member having an annular shape and press-fitted and fixed in the communication hole in an upper region in the communication hole; and a second holding member having an annular shape press-fitted and fixed to an outer peripheral surface of the signal pin in a lower region in the communication hole, wherein the signal pin is fixed so as to be sandwiched by the metal housing from an upper side and a lower side through the first holding member and the second holding member in the communication hole.

Advantageous Effects of Invention

According to the electrical connection socket according to the present disclosure, it is possible to maintain a high mechanical stability of the holding state of the signal pin in the metal housing with a simple configuration and a simple manufacturing process.

BRIEF DESCRIPTION OF DRAWINGS

FIGS. 9A to 9D are diagrams illustrating an example of a manufacturing process of the electrical connection socket according to the embodiment.

DESCRIPTION OF EMBODIMENTS

Figure 1:
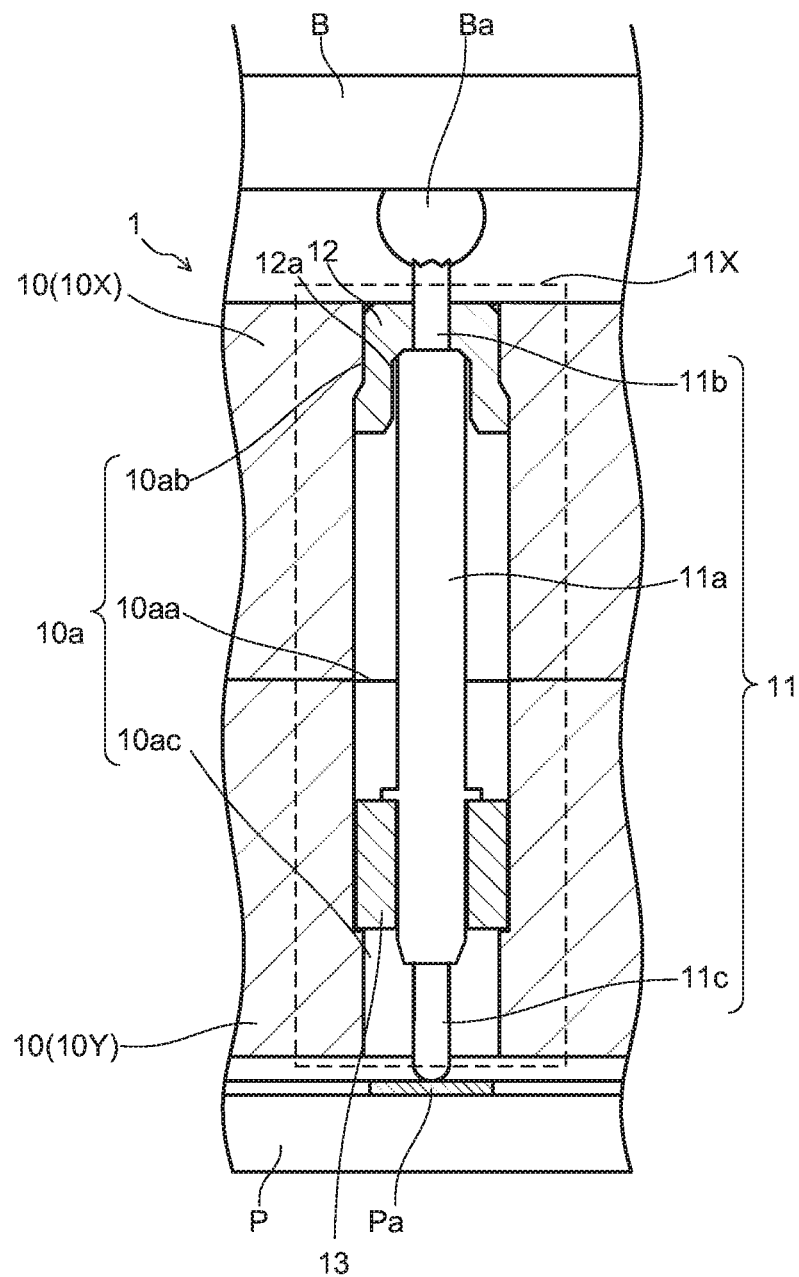
FIG. 1 is a side sectional view of an electrical connection socket according to an embodiment.

An embodiment of the present disclosure is described in detail below with reference to the accompanying drawings. In the specification and drawings, the components having substantially the same function are denoted with the same reference numerals, and overlapping description will be omitted.

Overall Configuration of Electrical Connection Socket

Hereinafter, with reference to FIGS. 1 to 4, an exemplary configuration of an electrical connection socket according to an embodiment will be described.

FIG. 1 is a side sectional view of electrical connection socket 1 according to the present embodiment.

Figure 2:
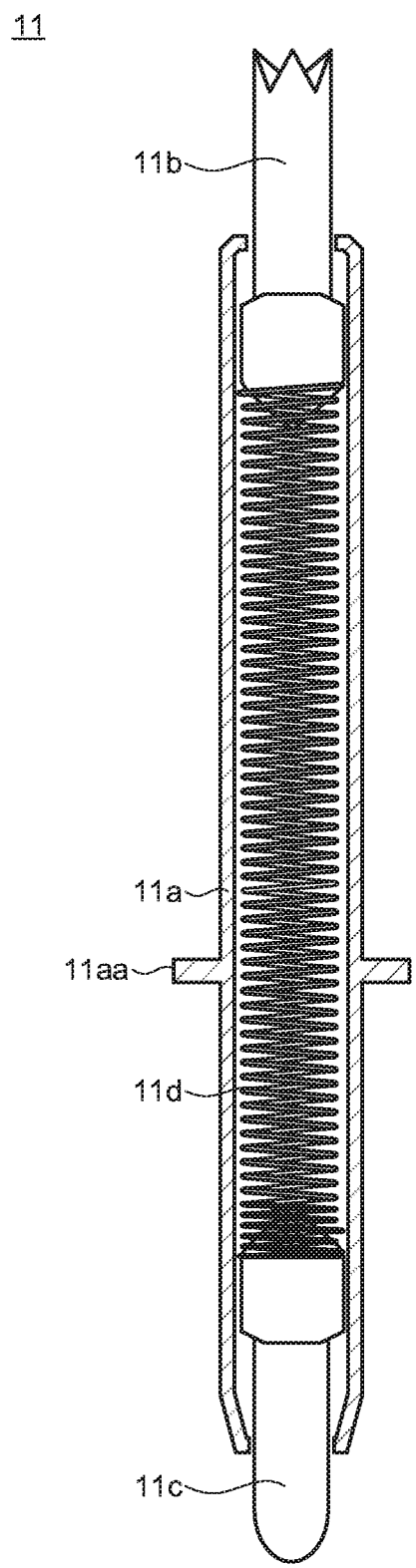
FIG. 2 is a side cross-sectional view of a signal pin of the electrical connection socket according to the embodiment.
Figure 3:
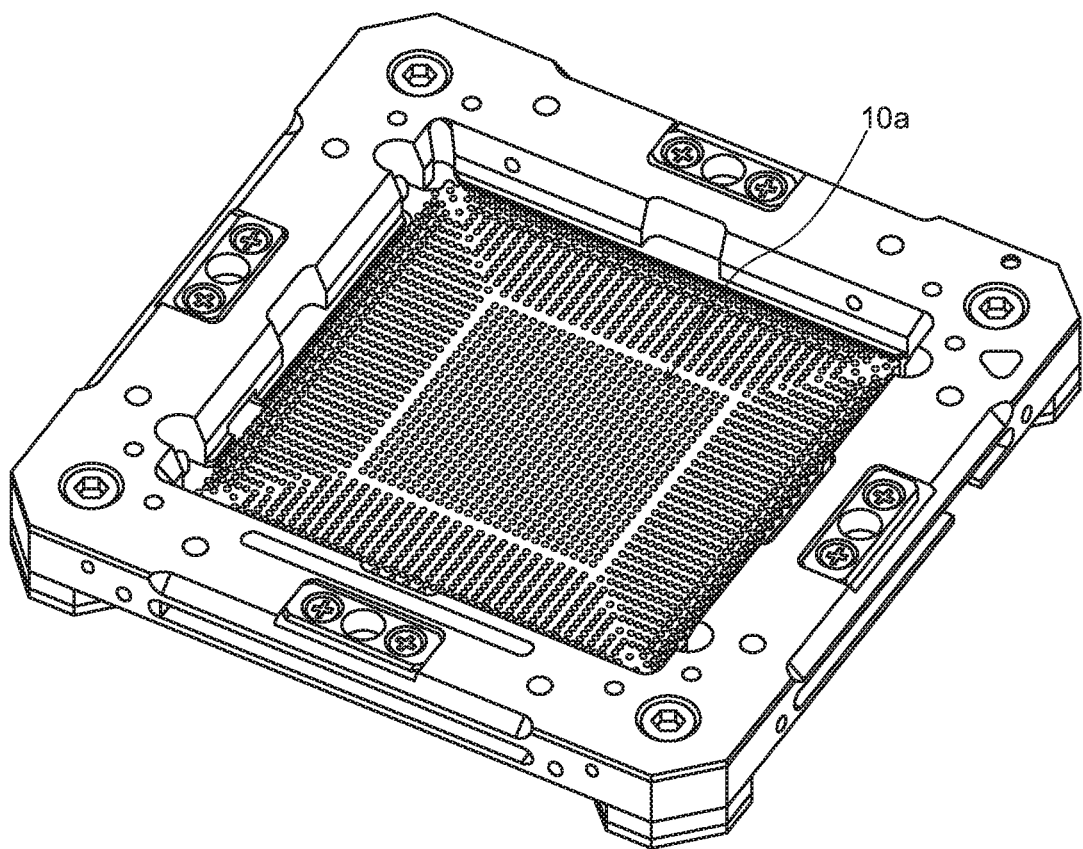
FIG. 3 is a perspective view of a metal housing of the electrical connection socket according to the embodiment as viewed from the top side.
Figure 4:
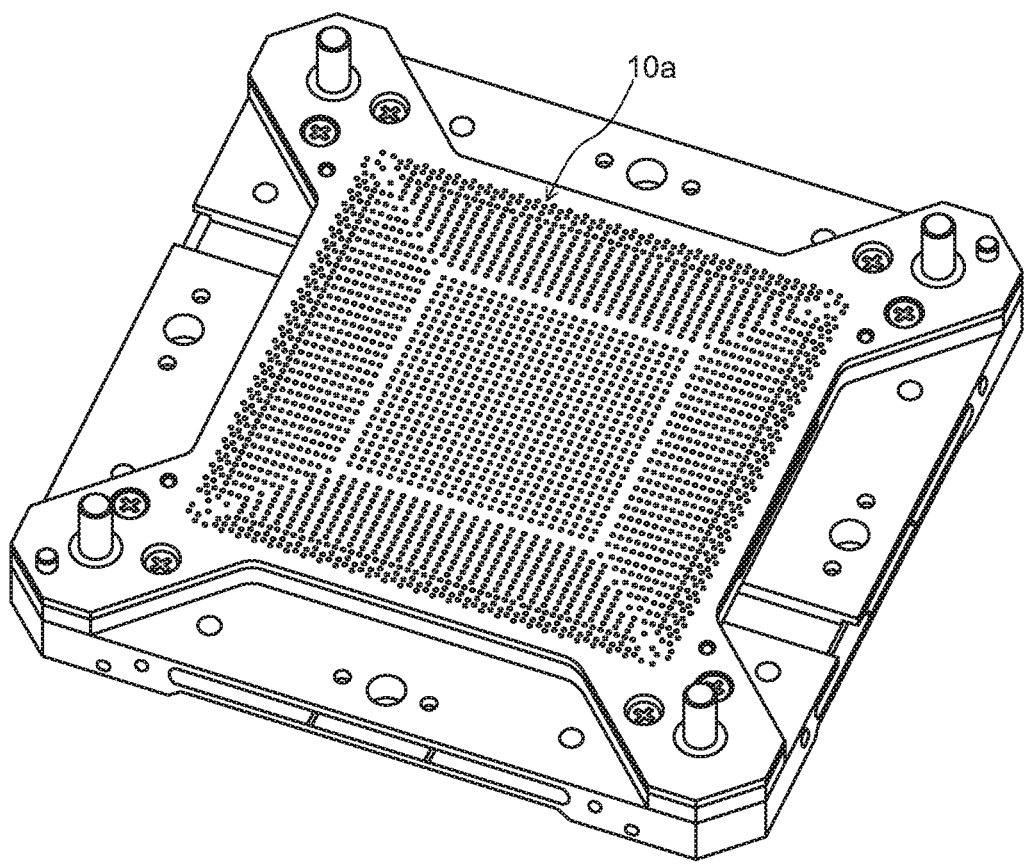
FIG. 4 is a perspective view of a metal housing of the electrical connection socket according to the embodiment as viewed from the bottom side.

FIG. 2 is a side cross-sectional view of signal pin 11 of electrical connection socket 1 according to the present embodiment. FIG. 3 is a perspective view of metal housing 10 of electrical connection socket 1 according to the present embodiment as viewed from the upper surface side. FIG. 4 is a perspective view of metal housing 10 of electrical connection socket 1 according to the present embodiment as viewed from the lower surface side.

Electrical connection socket 1 according to the present embodiment is a surface mount type socket, and is mounted on circuit board P (a first electrical component of the embodiment of the present invention). IC package B (a second electrical component of the embodiment of the present invention) is mounted at the upper portion of electrical connection socket 1. In the following description, circuit board P side as viewed from electrical connection socket 1 is set to as the lower side (corresponding to the lower side in FIG. 1), and IC package B side is set as the upper side (corresponding to the upper side in FIG. 1).

Electrical connection socket 1 according to the present embodiment is applicable to the use for conducting a performance test of IC package B. Electrical connection socket 1 electrically connects between IC package B disposed on its upper surface side and circuit board P of the IC test apparatus side disposed on its lower surface side. A most efficient method of maintaining the data transfer rate is direct soldering of IC package B to circuit board P; however, here, electrical connection is achieved using electrical connection socket 1 so that circuit board P and IC package B are detachable.

IC package B is, for example, an IC package of a ball grid array (BGA) type. IC package B includes solder ball Ba protruding downward from the lower surface of the package body as a terminal for external connection, for example.

Note that IC package B is mounted on electrical connection socket 1 by a latch provided in electrical connection socket 1 (not illustrated). In the state where the latch is closed, IC package B is mounted on electrical connection socket 1 such that its upper surface is pressed, and when the latch is opened, it is removed from electrical connection socket 1.

Circuit board P is a printed circuit board (PCB), for example. In circuit board P, for example, a signal path circuit pattern configured to generate a signal for a performance test of IC package B and to receive and process a signal from IC package B, and a ground pattern configured to supply a ground voltage, and the like are formed. In addition, on circuit board P, pad electrode Pa connected to the circuit pattern for the signal path is formed in the state where it is exposed from the surface of circuit board P.

Note that electrical connection socket 1 is mounted to circuit board P with a bolt, a nut or the like.

Electrical connection socket 1 includes metal housing 10, signal pin 11 configured to perform signal transmission between IC package B and circuit board P, top sleeve 12 (corresponding to the first holding member of the embodiment of the present invention) and bottom sleeve 13 (corresponding to the second holding member of the embodiment of the present invention). Top sleeve 12 and bottom sleeve 13 are configured to hold signal pin 11.

Metal housing 10 is formed of a metal member such as aluminum or copper, for example. In metal housing 10, for example, a protrusion (not illustrated) of the lower surface of metal housing 10 is disposed so as to make contact with grounding pad electrode Pa formed in circuit board P, and thus stabilization of the ground voltage of metal housing 10 is achieved.

Here, metal housing 10 is configured by connecting upper plate 10X and lower plate 10Y with a fixing member (e.g., a bolt and a nut).

Metal housing 10 includes communication hole 10a through which signal pin 11 is inserted. Communication hole 10a is formed so as to extend from the upper surface to the lower surface of metal housing 10.

Communication hole 10a has a circular shape in a plan view, for example. Along the extending direction of signal pin 11, communication hole 10a includes enlarged diameter portion 10aa in the central region, and reduced diameter portions 10ab and 10ac whose diameter is smaller than the enlarged diameter portion 10aa on the upper side and the lower side of the central region, respectively.

Signal pin 11 is disposed apart from the inner wall surface of communication hole 10a in communication hole 10a. That is, signal pin 11 is disposed in communication hole 10a in the state where signal pin 11 is electrically insulated from metal housing 10, and forms a signal path that functions as a coaxial line (hereinafter also referred to as "signal path 11X") with the inner wall surface of communication hole 10a. Note that signal pin 11 provides an impedance-matched signal path between IC package B and circuit board P through adjustment of the distance between the outer peripheral surface of signal pin 11 and the inner wall surface of communication hole 10a (which will be described later with reference to FIG. 8) and the like.

Signal pin 11 includes pin barrel 11a, first plunger 11b, second plunger 11c, and spring 11d (see FIG. 2).

Pin barrel 11a is a cylindrical member, and is disposed in communication hole 10a so as to extend in the vertical direction along communication hole 10a. Pin barrel 11a is fixed in communication hole 10a by top sleeve 12 and bottom sleeve 13 in the state where pin barrel 11a is apart from the inner wall surface of communication hole 10a. More specifically, pin barrel 11a is fixed so as to be sandwiched from the upper and lower sides in communication hole 10a with top sleeve 12 and bottom sleeve 13 therebetween. Note that locking portion 11aa having a protruding shape for setting the position of bottom sleeve 13 is provided on the outer peripheral surface of pin barrel 11a.

First plunger 11b is coupled to the upper end portion of pin barrel 11a in the state where first plunger 11b is slidable in the vertical direction. First plunger 11b is configured such that the lower end portion is connected to the upper end portion of spring 11d disposed in pin barrel 11a, and the upper end portion protrudes upward from the opening formed in the upper end portion of pin barrel 11a. In addition, the upper end portion of first plunger 11b protrudes upward past the upper surface of metal housing 10. With such a configuration, when IC package B is mounted to electrical connection socket 1, the upper end portion of first plunger 11b makes contact with solder ball Ba for the signal path of IC package B. Thus, electrical connection between signal pin 11 and the signal path in IC package B is performed. Note that the upper end portion of first plunger 11b has a concave shape along the outer shape of solder ball Ba for the purpose of easy contact with solder ball Ba.

Second plunger 11c is coupled to the lower end portion of pin barrel 11a in a vertically slidable manner. Second plunger 11c is configured such that the upper end portion is connected to the lower end portion of spring 11d disposed in pin barrel 11a, and the lower end portion protrudes downward from the opening formed in the lower end portion of pin barrel 11a. In addition, the lower end portion of second plunger 11c protrudes downward past the lower surface of metal housing 10. With such a configuration, when electrical connection socket 1 is mounted on circuit board P, the lower end portion of second plunger 11c makes contact with pad electrode Pa for the signal path formed on circuit board P. Thus, the electrical connection between signal pin 11 and the signal path in circuit board P is performed.

Spring 11d, which is disposed between first plunger 11b and second plunger 11c in pin barrel 11a, biases first plunger 11b and second plunger 11c in the upward direction and the downward direction, respectively. Thus, the contact pressure between the upper end portion of first plunger 11b and solder ball Ba of IC package B, and the contact pressure between the lower end portion of second plunger 11c and pad electrode Pa of circuit board P are ensured. In addition, spring 11d is configured to make contact with the inner wall surface of pin barrel 11a, and provides continuity between first plunger 11b, pin barrel 11a, and second plunger 11c.

Each of pin barrel 11a, first plunger 11b, second plunger 11c, and spring 11d is composed of a metal member. Note that the above-described members are disposed in the state where they are electrically insulated from the inner wall surface of communication hole 10a as described above.

With the above-described configuration, signal pin 11 relays the signal transmission between IC package B and circuit board P when the upper end portion of first plunger 11b makes contact with solder ball Ba of IC package B, and the lower end portion of second plunger 11c makes contact with pad electrode Pa of circuit board P.

Note that while only one signal pin 11 is illustrated in FIG. 1 for the sake of convenience in description, electrical connection socket 1 is provided with a plurality of the above-described signal pins 11. FIGS. 3 and 4 illustrates a plurality of communication holes 10a formed in metal housing 10, and signal pin 11 is inserted to each of these communication holes 10a (illustration of signal pins 11 are omitted FIGS. 3 and 4). Note that electrical connection socket 1 may further include a ground pin for supplying a ground voltage to IC package B from circuit board P, a power pin for supplying operating power to IC package B from circuit board P, and the like.

Top sleeve 12 is disposed in the upper region in communication hole 10a and is press-fitted and fixed in communication hole 10a. More specifically, top sleeve 12 is inserted from the lower side of communication hole 10a and is press-fitted and fixed so as to stop at the position of reduced diameter portion 10ab on the upper side in communication hole 10a.

Top sleeve 12 has an annular shape and includes through hole 12a formed along the extending direction of signal pin 11. The diameter of through-hole 12a is smaller on the upper side than on the lower side. Top sleeve 12 is disposed such that the outer peripheral surface of signal pin 11 is surrounded in through hole 12a. More specifically, first plunger 11b is disposed apart from the inner wall surface of through hole 12a of top sleeve 12, and pin barrel 11a is disposed such that the upper end portion is in contact with the inner wall surface of through hole 12a of top sleeve 12.

Bottom sleeve 13 is disposed in the lower region in communication hole 10a and is press-fitted and fixed to the outer peripheral surface of signal pin 11. Bottom sleeve 13 has an annular shape. In addition, bottom sleeve 13 is inserted in communication hole 10a together with pin barrel 11a in the state where bottom sleeve 13 is press-fitted and fixed to the outer peripheral surface of pin barrel 11a. The position of bottom sleeve 13 is set by the locking portion 11aa provided on the outer peripheral surface of pin barrel 11a.

Bottom sleeve 13 is disposed such that the lower end portion is in contact with reduced diameter portion 10ac on the lower side of communication hole 10a, and is engaged with reduced diameter portion 10ac, for example.

When upper plate 10X and lower plate 10Y of metal housing 10 are connected to each other, pin barrel 11a is fixed so as to be sandwiched from the upper and lower sides in communication hole 10a with top sleeve 12 and bottom sleeve 13 therebetween (which will be described later with reference to FIG. 9).

An insulating elastic member is used for each of top sleeve 12 and bottom sleeve 13. Typically, a low-permittivity material (e.g., liquid crystal polymer) is used as top sleeve 12 and bottom sleeve 13, from the viewpoint of suppressing reduction in the characteristic impedance of signal path 11X formed by signal pin 11.

Design of Signal Path Formed by Signal Pin

Next, the following describes a design of signal path 11X formed by signal pin 11 in electrical connection socket 1 according to the present embodiment.

In electrical connection socket 1 according to the present embodiment, in order to provide an impedance-matched signal path between the signal path formed on circuit board P and the signal path formed on IC package B, the coaxial structure of signal path 11X (the diameter of signal pin 11, the diameter of communication hole 10a, the distance between the outer peripheral surface of signal pin 11 and the inner wall surface of communication hole 10a, and the like) is set in accordance with the characteristic impedance of a predetermined reference value (e.g., 50Ω).

Figure 5:
FIG. 5 is a diagram for explaining a characteristic impedance of a signal path having a typical coaxial structure.

FIG. 5 is a diagram for explaining the characteristic impedance of a signal path of a typical coaxial structure.

The characteristic impedance of a signal path of a coaxial structure is typically defined as in the following Equation (1).

$$Z_0 = (138/\sqrt{k})\log(d_1/d_2) \qquad \text{Equation (1)}$$

(where $d_2$ is the outside diameter of the inner conductor, $d_1$ is the inside diameter of the outer conductor surrounding the periphery of the inner conductor, and k is the relative permittivity of the dielectric between the inner conductor and the outer conductor)

Here, for example, in the case where the material interposed between the inner conductor and the outer conductor is air (relative permittivity: 1), the characteristic impedance of the coaxial line can be adjusted to a predetermined characteristic impedance by adjusting diameter $d^1$ of the inner conductor and diameter $d_2$ of the outer conductor.

If the material interposed between the inner conductor and the outer conductor is not air or vacuum, relative permittivity k of the dielectric is greater than the relative permittivity of air (approximately 1.0), and accordingly the characteristic impedance $Z^0$ of the coaxial line is small. Likewise, the propagation speed of the signal in the coaxial line decreases as the relative permittivity of the dielectric interposed between the inner conductor and the outer conductor increases.

In electrical connection socket 1, the inner conductor corresponds to signal pin 11, and the outer conductor corresponds to the inner wall surface of communication hole 10a. In addition, in electrical connection socket 1, most of the dielectric interposed between the outer peripheral surface of signal pin 11 and the inner wall surface of communication hole 10a is air.

Now, a coaxial structure of signal path 11X of electrical connection socket 1 according to the present embodiment is described with reference to FIGS. 6 to 8.

Figure 6:
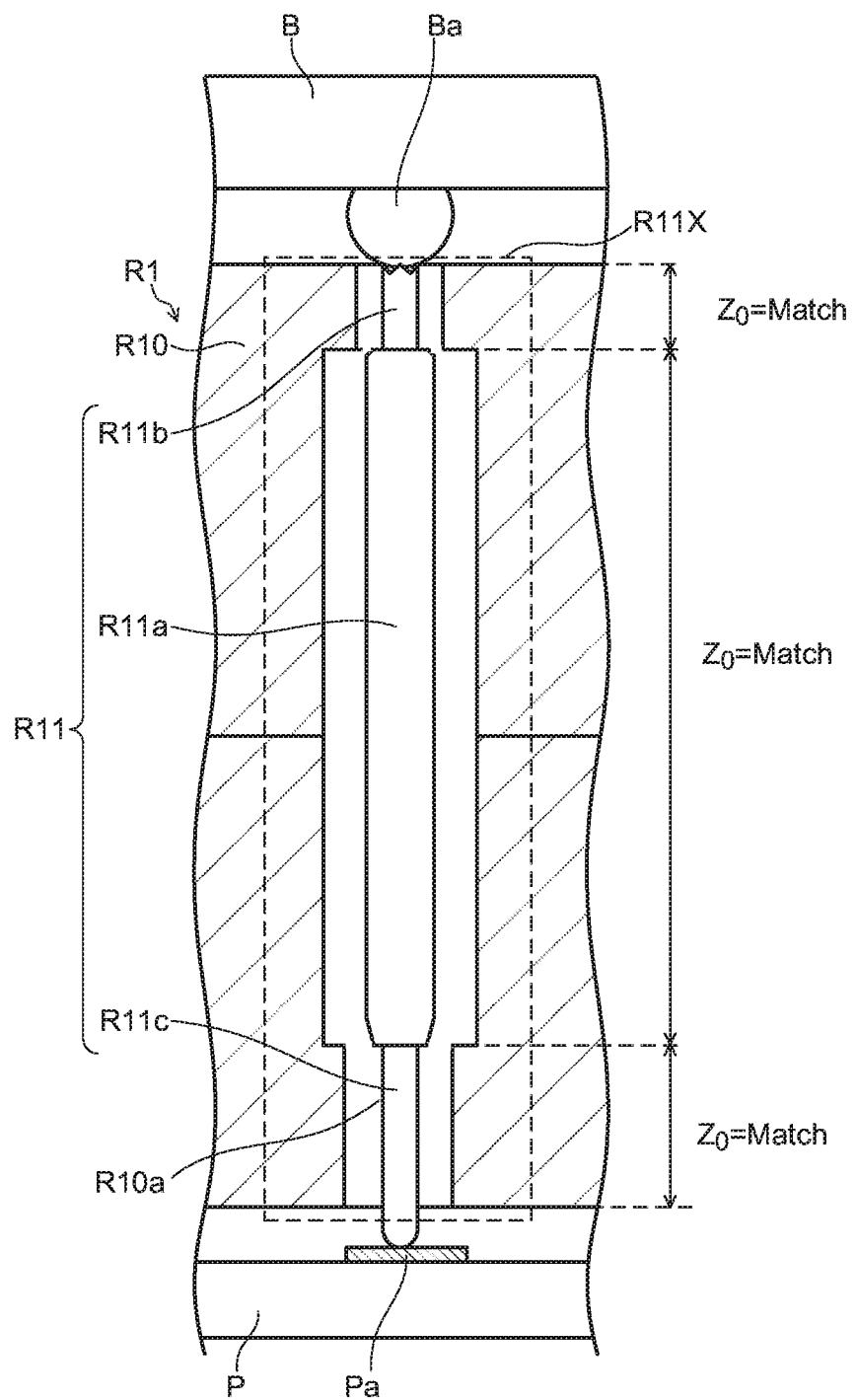
FIG. 6 is a diagram illustrating a configuration of an electrical connection socket according to Comparative Example 1.

FIG. 6 is a diagram illustrating a configuration of an electrical connection socket according to Comparative Example 1. FIG. 7 is a diagram illustrating a configuration of an electrical connection socket according to Comparative Example 2. FIG. 8 is a diagram illustrating a configuration of electrical connection socket 1 according to the present embodiment.

In the drawings, the characteristic impedance in each region of the coaxial line is shown in comparison with a reference value (e.g., 50Ω). In the drawings, $Z_0$=Match indicates a region where the characteristic impedance matches the reference value, $Z_0$=High indicates a region where the characteristic impedance is higher than the reference value, and $Z_0$=Low indicates a region where the characteristic impedance is lower than the reference value.

Note that the components of the electrical connection socket according to Comparative Example 1 which correspond to the components of electrical connection socket 1 according to the present embodiment are denoted with the reference symbols of the components of electrical connection socket 1 according to the present embodiment with symbols R at the heads of respective reference symbols. In addition, the components of the electrical connection socket according to Comparative Example 2 which correspond to the components of electrical connection socket 1 according to the present embodiment are denoted with the reference symbols of the components of electrical connection socket 1 according to the present embodiment with symbols Q at the heads of respective reference symbols.

Electrical connection socket R1 according to Comparative Example 1 is composed only of metal housing R10 and signal pin R11 (see FIG. 6). In electrical connection socket R1 according to the Comparative Example 1, the characteristic impedance of signal path R11X can be relatively easily adjusted by adjusting only the diameter of signal pin R11, the diameter of communication hole R10a, and the distance between the outer peripheral surface of signal pin R11 and the inner wall surface of communication hole R10a. However, in electrical connection socket R1 according to Comparative Example 1, signal pin R11 is not held in communication hole R10a of metal housing R10, and therefore may fall off from communication hole R10a of metal housing R10 or may be mechanically unstable in communication hole Q10a.

Figure 7:
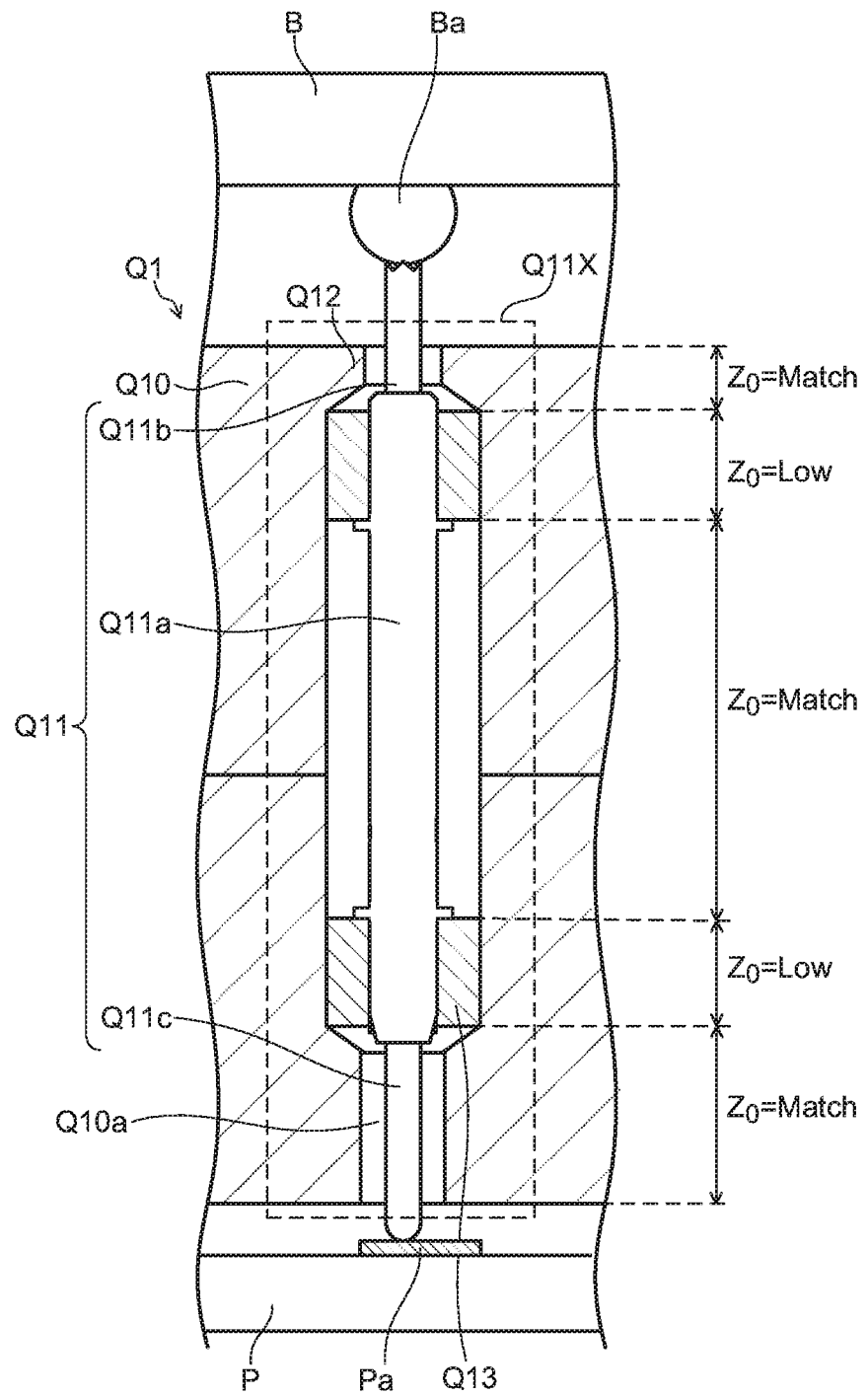
FIG. 7 is a diagram illustrating a configuration of an electrical connection socket according to Comparative Example 2.
Figure 8:
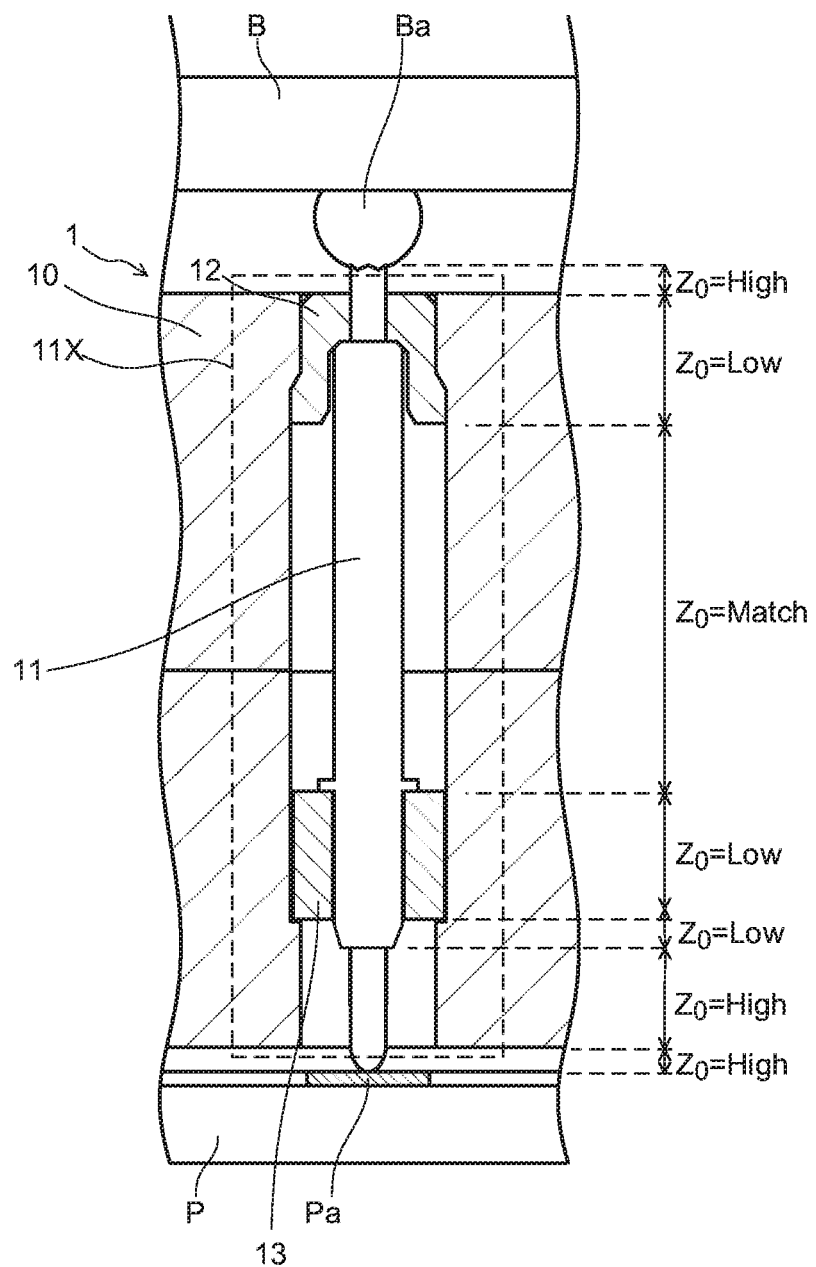
FIG. 8 is a diagram illustrating a configuration of an electrical connection socket according to the embodiment.

In electrical connection socket Q1 according to Comparative Example 2, signal pin Q11 is held by holding members Q12 and Q13 in communication hole Q10a of metal housing Q10 (see FIG. 7). Therefore, falling off of signal pin Q11 from metal housing Q10 and mechanically instability in communication hole Q10a can be reduced.

However, the characteristic impedance of the region where signal pin Q11 is held by holding members Q12 and Q13 (hereinafter referred to as "holding portion") depends on the relative permittivity of holding members Q12 and Q13, and therefore the characteristic impedance is lower than the reference value ($Z_0$=Low). This results in mismatched positions in the characteristic impedances of signal path Q11X, which leads to signal degradation during signal transmission.

Note that although the mismatch of the characteristic impedance can be reduced by using a low-permittivity material for holding members Q12 and Q13, it is inevitable that the reduction in the characteristic impedance in the holding portion affects the mismatch of the entire characteristic impedance.

Also in electrical connection socket 1 according to the present embodiment, the characteristic impedance of signal path 11X in the holding portion (the region where signal pin 11 is held by bottom sleeve 13 and top sleeve 12) is lower than the reference value ($Z_0$=Low) (see FIG. 8) as in electrical connection socket Q1 according to Comparative Example 2. However, in electrical connection socket 1 according to the present embodiment, a region where the characteristic impedance is higher than the reference value ($Z_0$=High) is intentionally provided in a region adjacent to the holding portion of signal path 11X, unlike electrical connection socket Q1 according to Comparative Example 2. In other words, a region where the characteristic impedance is lower than the reference value (Z0=Low) and a region where the characteristic impedance is higher than the reference value are alternately provided in signal path 11X.

In this manner, by setting the characteristic impedance of the region adjacent to the holding portion in signal path 11X to a value higher than the reference value (e.g., 50Ω), the reduction in the characteristic impedance of the holding portion can be compensated. It is thus possible to set a state where the impedance is matched between the signal path formed on circuit board P and the signal path formed on IC package B in signal path 11X in its entirety.

More specifically, the central region of signal pin 11 (pin barrel 11a) is configured such that the characteristic impedance of signal path 11X matches the reference value ($Z_0$=Match) through adjustment of the distance between the outer peripheral surface of pin barrel 11a and the inner wall surface of communication hole 10a. On the other hand, in the region held by bottom sleeve 13 and top sleeve 12 in signal pin 11 (pin barrel 11a), the characteristic impedance of signal path 11X is lower than the reference value ($Z_0$=Low).

Therefore, in the region adjacent to the lower side of bottom sleeve 13 in signal pin 11, the distance between the outer peripheral surface of pin barrel 11a and the inner wall surface of communication hole 10a is adjusted ($Z_0$=High) such that the characteristic impedance of signal path 11X is higher than the reference value. Specifically, the distance between the outer peripheral surface of signal pin 11 (second plunger 11c) and the inner wall surface of communication hole 10a in this region is configured to be greater than the distance between the inner wall surface of communication hole 10a and the outer peripheral surface in the central region of signal pin 11 (pin barrel 11a).

In addition, the region adjacent to the upper side of top sleeve 12 in signal pin 11 (i.e., the region of first plunger 11b) protrudes upward from communication hole 10a so as not face the inner wall surface of communication hole 10a, and thus the characteristic impedance of signal path 11X thereof is higher than the reference value ($Z_0$=High). In other words, in the present embodiment, the increase in the characteristic impedance in the region protruding upward from communication hole 10a in signal pin 11 is utilized to compensate for the reduction in the characteristic impedance in the region held by top sleeve 12.

Also in electrical connection socket Q1 according to Comparative Example 2, the characteristic impedance is higher than the reference value ($Z_0$=High) in the region protruding upward from communication hole 10a of signal pin 11, and in the region protruding downward from communication hole 10a of signal pin 11. However, in electrical connection socket Q1 according to Comparative Example 2, the region where the characteristic impedance is higher than the reference value ($Z_0$=High) is not adjacent to the region whose characteristic impedance is lower than the reference value ($Z_0$=Low), and consequently the region where the characteristic impedance is higher than the reference value ($Z_0$=High) cannot compensate for the reduction of the characteristic impedance of the region where the characteristic impedance is lower than the reference value ($Z_0$=Low).

Manufacturing Process of Electrical Connection Socket

FIG. 9 is a diagram illustrating an example of a manufacturing process of electrical connection socket 1 according to the present embodiment.

FIGS. 9A to 9D illustrate steps of mounting signal pin 11, top sleeve 12, and bottom sleeve 13 to communication hole 10a of the metal housing 10 on a time-series basis. Note that these series of steps are performed with an automatic assembly apparatus (not illustrated) including a component conveying device, and a press-fitting device and the like, for example.

First, the automatic assembly apparatus prepares upper plate 10X of metal housing 10, and press-fits and fixes top sleeve 12 to communication hole 10a of upper plate 10X (FIG. 9A). At this time, in the state where flat-plate-shaped second jig T2 is disposed on the upper surface of metal housing 10 so as to close communication hole 10a, the automatic assembly apparatus moves top sleeve 12 to push top sleeve 12 upward from the lower side of communication hole 10a, using a rod-shaped first jig T1. Thus, top sleeve 12 is elastically deformed so as to reduce the diameter when reaching reduced diameter portion 10ab of the upper portion of communication hole 10a, and is press-fitted and fixed by the frictional force with the inner wall surface of communication hole 10a. Note that top sleeve 12 is disposed in communication hole 10a such that the upper surface of top sleeve 12 and the upper surface of metal housing 10 are flush with each other with the second jig T2 serving as a stopper.

The automatic assembly apparatus then inserts signal pin 11 into the communication hole 10a from the lower side (FIG. 9B). This step is performed in the state where bottom sleeve 13 having an annular shape is press-fitted and fixed in the lower region of pin barrel 11a in advance. Through this step, signal pin 11 is disposed such that the first plunger 11a inserted through through hole 12a formed in top sleeve 12 and that the upper end portion of pin barrel 11a is in contact with the lower portion of top sleeve 12.

Next, the automatic assembly apparatus connects lower plate 10Y to upper plate 10X so as to align the communication holes 10a to each other (FIGS. 9C and 9D). Through this step, the lower end portion of bottom sleeve 13 is brought into contact with reduced diameter portion 10ac of the lower side of communication hole 10a. Then, through this step, signal pin 11 is set to a state where first plunger 11b protrudes upward from communication hole 10a, and second plunger 11c protrudes downward from communication hole 10a. In addition, pin barrel 11a of signal pin 11 is fixed so as to be sandwiched from the upper and lower sides in communication hole 10a with top sleeve 12 and bottom sleeve 13 therebetween in communication hole 10a.

Through the above-described steps, signal pin 11, top sleeve 12, and bottom sleeve 13 are attached to communication hole 10a of metal housing 10.

How to Use Electrical Connection Socket

Electrical connection socket 1 according to the present embodiment is used as follows, for example.

First, electrical connection socket 1 is mounted on circuit board P. At this time, for example, a protrusion (not illustrated) provided on the lower surface of metal housing 10 makes contact with a grounding pad electrode (not illustrated) for circuit board P, and thus the metal housing 10 is grounded.

IC package B is then mounted on electrical connection socket 1. Thereafter, when the upper surface of IC package B is pressed downward using a latch provided in electrical connection socket 1, solder ball Ba of IC package B makes contact with the first plunger 11b of signal pin 11. Thus, the electrical contact between the first plunger 11b of signal pin 11 and solder ball Ba is ensured.

Then, as IC package B is lowered, second plunger 11c of signal pin 11 makes contact with pad electrode Pa on circuit board P. Thus, the electrical contact between pad electrode Pa and the second plunger 11c of signal pin 11 is ensured.

At this time, biasing forces of spring 11d in opposite directions along the vertical direction are exerted on the first plunger 11b and the second plunger 11c of signal pin 11. Thus, the contact pressure between solder ball Ba of IC package B and the first plunger 11b of signal pin 11, and the contact pressure between pad electrode Pa of circuit board P and the second plunger 11c of signal pin 11 are appropriately secured and maintained.

IC package B and circuit board P are electrically connected through electrical connection socket 1 in the above-described manner, and thus a performance test of IC package B or the like is performed.

Effect

As described above, electrical connection socket 1 according to the present embodiment includes communication hole 10a for communicating between its upper surface and lower surface, and includes metal housing 10 to which the first electrical component (e.g., circuit board P) and the second electrical component (e.g., IC package B) are mounted on the lower surface side and on the upper surface side, respectively, signal pin 11 disposed apart from the inner wall surface of communication hole 10a in communication hole 10a, with one end thereof being electrically connected to the terminal (e.g., pad electrode Pa) of the first electrical component P and the other end thereof being electrically connected to the terminal (e.g., solder ball terminal Ba) of the second electrical component B, first holding member 12 (top sleeve 12) having an annular shape and press-fitted and fixed in an upper region in communication hole 10a, and second holding member 13 (bottom sleeve 13) having an annular shape and press-fitted and fixed to the outer peripheral surface of signal pin 11 in a lower region in communication hole 10a. Signal pin 11 is fixed so as to be sandwiched from the upper and lower sides through first and second holding members 12 and 13 in communication hole 10a.

In this manner, with electrical connection socket 1 according to the present embodiment, it is possible to maintain high mechanical stability of the holding state of signal pin 11 in metal housing 10 with a simple configuration and a simple manufacturing process. Thus, since the distance between the inner wall surface of communication hole 10a and the outer peripheral surface of signal pin 11 can be appropriately maintained, the electrical characteristics of signal pin 11 (e.g., the characteristic impedance of the signal path formed by signal pin 11) can also be favorably maintained.

In electrical connection socket 1 according to the present embodiment, signal pin 11 forms signal path 11X lower than a predetermined characteristic impedance serving as a reference in the first and second regions held by first and second holding members 12 and 13, and forms signal path 11X higher than the predetermined characteristic impedance in the third and fourth regions adjacent to the first and second regions in the extending direction of signal pin 11 (e.g., in the region of second plunger 11c and the region where signal pin 11 protrudes upward from communication hole 10a).

Accordingly, with electrical connection socket 1 according to the present embodiment, it is possible to provide signal path 11X with matched impedance between circuit board P and IC package B so as to compensate for the reduction in the characteristic impedance in the region held by the holding members 12 and 13. Thus, impedance-matched signal path 11X can be formed, and signal degradation during signal transmission can be reduced.

Other Embodiments

The present invention is not limited to the above-described embodiments, and various modifications may be made.

IC package B and circuit board P are described in the above-described embodiment as examples of the electrical component for the signal transmission relay using electrical connection socket 1. However, any electrical components, such as a coaxial cable, may be connected to electrical connection socket 1.

In addition, a configuration of the use for a test of IC package B is described as an example of electrical connection socket 1 in the above-described embodiment. However, the application of electrical connection socket 1 may be any application for electrical connection as well as the use for a test of IC package B.

In addition, the configuration of directly connecting the protrusion provided on the lower surface of metal housing 10 and the grounding pad electrode formed on the upper surface of circuit board P is described in the above-described embodiment as an example of the configuration for grounding metal housing 10. However, the configuration for securing the ground potential of metal housing 10 is not limited. For example, the ground potential of metal housing 10 may be ensured by inserting a ground pin into a communication hole in metal housing 10 such that the ground pin and the inner wall surface of the communication hole make contact with each other.

It should be understood that various modifications, combinations, sub-combinations and alterations may occur depending on design requirements and other factors in so far as they are within the scope of the appended claims or the equivalents thereof. Although embodiments of the present invention has been described and illustrated in detail, it is clearly understood that the same is by way of illustrated and example only and is not to be taken by way of limitation, the scope of the present invention being interpreted by terms of the appended claims.

This application is entitled to and claims the benefit of disclosure of the U.S. temporary application of 62/592,668, filed Nov. 30, 2017, and the disclosure of the U.S. temporary application of 62/592,670, filed Nov. 30, 2017, the disclosure of which including the specification, drawings and abstract is incorporated herein by reference in its entirety.

INDUSTRIAL APPLICABILITY

With the electrical connection socket according to the present disclosure, it is possible to maintain high mechanical stability of the holding state of the signal pin in the metal housing with a simple configuration and a simple manufacturing process.

REFERENCE SIGNS LIST

1 Electrical connection socket
10 Metal housing
10a Communication hole
11 Signal pin
11X Signal path
11a Pin barrel
11b First plunger
11c Second plunger
11d Spring
12 Top sleeve
13 Bottom sleeve
B IC Package
Ba Solder ball
P Circuit board
Pa Pad electrode

What is claimed is:

1. A method of manufacturing an electrical connection socket for relaying transmission and reception of an electrical signal between a first electrical component and a second electrical component,
the electrical connection socket comprising:
a metal housing including a communication hole for communicating between an upper surface of the metal housing and a lower surface of the metal housing, the metal housing being disposed such that the first electrical component is disposed at the lower surface, and that the second electrical component is disposed at the upper surface, wherein
the metal housing being configured by connecting an upper plate and a lower plate,
the communication hole being configured by communicating a first through hole formed in the upper plate and a second through hole formed in the lower plate,
first through hole having a first reduced diameter portion in the upper area thereof, and
the second through hole having a second reduced diameter portion in the lower area thereof;
a signal pin disposed apart from an inner wall surface of the communication hole in the communication hole such that one end of signal pin is electrically connected to a terminal of the first electrical component and that another end of the signal pin is electrically connected a terminal of the second electrical component;
a first holding member having an annular shape and press-fitted and fixed in the communication hole in an upper region in the communication hole; and
a second holding member having an annular shape press-fitted and fixed to an outer peripheral surface of the signal pin in a lower region in the communication hole; and the method comprising:
- a first step of preparing the upper plate, and press-fitting and fixing the first holding member into the first reduced diameter portion of the first through hole by pushing the first holding member into the first through hole of the upper plate from the lower side of the first through hole;
- a second step of inserting the signal pin into the first through hole of the upper plate from the lower side of the first through hole, with the second holding member being press-fitted and fixed in the lower region of the signal pin; and
- a third step of connecting the lower plate to the upper plate, and fixing the signal pin via the first holding member and second holding member in the communication hole, with the second holding member being engaged with the second reduced diameter portion, by sandwiching the signal by the upper plate and the lower plate.

2. The method of manufacturing the electrical connection socket according to claim 1, wherein the signal pin includes:
- a pin barrel fixed by the first holding member and the second holding member in the communication hole; and
- a first plunger and a second plunger coupled to the pin barrel at an upper end portion and a lower end portion of the pin barrel, respectively, such that the first plunger and the second plunger are slidable in a vertical direction.

3. The method of manufacturing the electrical connection socket according to claim 1, wherein an upper end surface of the first holding member is flush with the upper surface of the metal housing.

4. The method of manufacturing the electrical connection socket according to claim 1, wherein each of the first holding member and the second holding member is composed of an insulating elastic member.

5. The method of manufacturing the electrical connection socket according to claim 1, wherein a characteristic impedance of the signal path formed by the signal pin is lower than a predetermined characteristic impedance serving as a reference in a first region and a second region, and is higher than the predetermined characteristic impedance in a third region and a fourth region adjacent to the first region and the second region, the first region and the second region being regions where the signal pin is held by the first holding member and the second holding member.

6. The method of manufacturing the electrical connection socket according to claim 1,
- wherein the first electrical component is a circuit board; and
- wherein the second electrical component is an IC package.

7. An electrical connection socket manufactured by the method of claim 1.

* * * * *